(12) United States Patent
Duron et al.

(10) Patent No.: US 11,703,929 B2
(45) Date of Patent: Jul. 18, 2023

(54) SHELF WITH SOLAR CELL EVENT TRIGGER

(71) Applicant: SYMBOL TECHNOLOGIES, LLC, Holtsville, NY (US)

(72) Inventors: Mark W. Duron, Mastic, NY (US); Jimmy Chabra, Massapequa, NY (US)

(73) Assignee: Symbol Technologies, LLC, Holtsville, NY (US)

( * ) Notice: Subject to any disclaimer, the term of this patent is extended or adjusted under 35 U.S.C. 154(b) by 0 days.

(21) Appl. No.: 16/842,508

(22) Filed: Apr. 7, 2020

(65) Prior Publication Data
US 2020/0233480 A1 Jul. 23, 2020

Related U.S. Application Data

(63) Continuation of application No. 15/856,811, filed on Dec. 28, 2017, now Pat. No. 10,649,517.

(51) Int. Cl.
| | |
|---|---|
| *G06F 1/32* | (2019.01) |
| *G06F 1/3212* | (2019.01) |
| *G06F 1/28* | (2006.01) |
| *A47F 5/00* | (2006.01) |
| *H01L 31/042* | (2014.01) |
| *H02S 20/20* | (2014.01) |
| *A47F 10/02* | (2006.01) |
| *A47B 96/02* | (2006.01) |

(52) U.S. Cl.
CPC ............ *G06F 1/3212* (2013.01); *A47B 96/02* (2013.01); *A47F 5/0018* (2013.01); *A47F 5/0043* (2013.01); *A47F 10/02* (2013.01); *A47F 2010/025* (2013.01); *G06F 1/28* (2013.01); *H01L 31/042* (2013.01); *H02S 20/20* (2014.12)

(58) Field of Classification Search
CPC .. A47F 5/0018; A47F 10/02; A47F 2010/025; A47F 5/0043; G06F 1/28; G06F 1/3212; H01L 31/042; A47B 96/02; H02S 20/20
USPC .......................................................... 700/298
See application file for complete search history.

(56) References Cited

U.S. PATENT DOCUMENTS

| | | | | |
|---|---|---|---|---|
| 4,661,758 | A * | 4/1987 | Whittaker | H02J 7/35 320/101 |
| 5,465,085 | A * | 11/1995 | Caldwell | G06F 3/147 235/383 |
| 5,575,284 | A * | 11/1996 | Athan | A61B 5/14551 600/323 |
| 6,340,958 | B1 * | 1/2002 | Cantu | G06F 3/147 235/383 |

(Continued)

*Primary Examiner* — Chun Cao

(57) ABSTRACT

An apparatus includes a shelf having a front edge, a solar cell circuit disposed at the front edge, a display screen, and a controller operatively coupled to the solar cell circuit and the display screen. The controller monitors the period of a waveform of a charging voltage of a storage capacitor of the solar cell circuit, displays an image on the display screen in response to a change in the waveform timing. A system includes a plurality of shelves each having a front edge, a solar cell circuit disposed at the front edge of each of the plurality of shelves, and a controller operatively coupled to the solar cell circuits. The controller monitors the frequency at which a power transfer of each solar cell circuit occurs, and signals a device in response to a change in the frequency at which the power transfer occurs.

10 Claims, 4 Drawing Sheets

(56) References Cited

U.S. PATENT DOCUMENTS

| | | | |
|---|---|---|---|
| 7,508,316 B1* | 3/2009 | Arrar | A47G 33/008 |
| | | | 434/245 |
| 10,649,517 B2* | 5/2020 | Duron | A47F 5/0018 |
| 2009/0315707 A1* | 12/2009 | Candy | G01V 3/104 |
| | | | 340/540 |
| 2011/0111811 A1* | 5/2011 | Juang | G06F 1/26 |
| | | | 455/573 |
| 2011/0205201 A1* | 8/2011 | Lorkowski | G09G 3/344 |
| | | | 345/207 |
| 2014/0084854 A1* | 3/2014 | Eifuku | H02J 2207/40 |
| | | | 320/107 |
| 2015/0108838 A1* | 4/2015 | Pierce | H02J 7/0042 |
| | | | 307/25 |
| 2017/0256981 A1* | 9/2017 | Fukui | H02J 7/0068 |

\* cited by examiner

SHELF WITH SOLAR CELL EVENT TRIGGER

BACKGROUND OF THE INVENTION

Solar cells may be used to power devices on shelves, such as a retail shelf. For example, a scale may measure the weight of contents on the shelf in order to determine the quantity of contents on the shelf. A position sensor may detect movement of contents on the shelf. Lights positioned on or near the shelves may be provided to illuminate the contents of the shelf. Solar cells positioned on or near the shelves may charge and recharge a battery. A microprocessor may draw its power from the battery, and periodically activate the scale, position sensor, lights or other devices with the shelf, which are also powered from the battery. When activated, these devices may perform their respective functions, which may include communicating with the microprocessor (e.g., in order to inventory shelf contents). In order to efficiently utilize energy from the battery, the microprocessor controls the power harvesting of the solar cell and powers down devices when they are not in use. Moreover, in order to interact with people, such as customers, the shelves require a separate photo detector. Generally, these photo-detectors are very basic devices and do not readily distinguish between a customer walking by and a customer interacting with the shelf contents (e.g., reaching for a product on the shelf). Cameras used in conjunction with human-recognition software may be used, though this is quite complex and costly.

Accordingly, there is a need for system and method for improved solar-powered shelves that interact with people.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
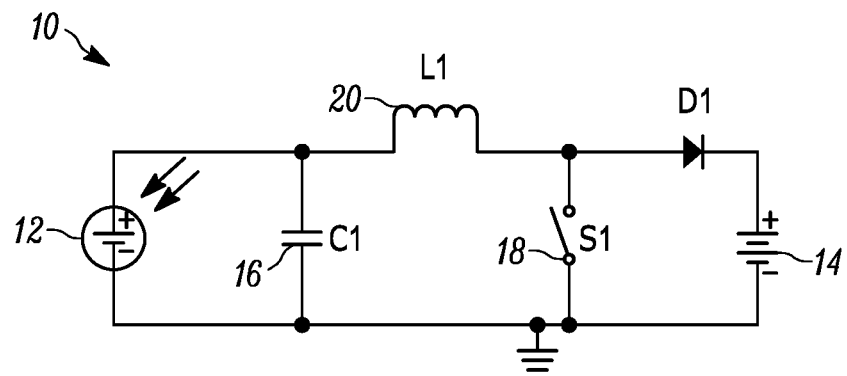
FIG. 1 is a schematic circuit diagram of a solar cell circuit.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

One aspect of the present disclosure provides an apparatus that includes a shelf, a solar cell circuit, a display screen and a controller. The shelf has a front edge, and the solar cell is disposed at the front edge. The controller is operatively coupled to the solar circuit and the display screen. The controller is adapted to monitor the period of a waveform of a charging voltage of a storage capacitor of the solar cell circuit. The controller is further adapted to display an image on the display screen in response to a change in the waveform timing.

Another aspect of the present disclosure provides a system that includes a plurality of shelves, a plurality of solar cell circuits, and a controller. Each of the shelves has a front edge, and a solar cell circuit is disposed at the front edge of each shelf. The controller is operatively coupled to the solar cell circuits. The controller is adapted to monitor the frequency at which a power transfer of each solar cell circuit occurs. The controller is further adapted to signal a device in response to a change in the frequency at which the power transfer occurs.

FIG. 1 is a circuit diagram of a solar cell circuit 10 in accordance with an embodiment of this disclosure. As will be understood by those of ordinary skill in the art, the circuit of FIG. 1 is an idealized model that is electrically equivalent to a solar cell circuit and is based on discrete ideal electrical components. For example, the idealized model of the solar cell circuit 10 in FIG. 1 assumes no dissipation of energy due to resistance. However, it will be understood that no circuit is considered ideal in practice. It will also be understood that different circuit configurations and components may be utilized other than what are shown here.

Referring to FIG. 1, the solar cell circuit 10 includes a solar cell 12 (also referred to as a photovoltaic cell) coupled in parallel with a rechargeable battery 14. As is generally understood, the solar cell 12 absorbs light photons, both artificial and natural, by a reactive material (e.g., layers of p-type and n-type silicon) that releases electrons. The electrons are captured with a resulting electric current that may be stored as electricity in the battery 14.

The solar cell 12 outputs maximum current when loaded by a short circuit, and outputs maximum voltage when loaded by an open circuit. In terms of charging the battery, the solar cell 12 outputs maximum power at a voltage that is approximately 80% of the open circuit voltage. This voltage is known as the Maximum Power Point (MPP), and is the operating point at which power transfer occurs to charge the battery 14. Above or below the MPP, the efficiency in charging the battery 14 decreases.

The solar cell circuit 10 shown in FIG. 1 is in a boost configuration with a storage capacitor (C1) 16 coupled in parallel with the solar cell 12. The optimum voltage (or potential) across the capacitor 16 for power transfer is the MPP voltage of the solar cell 12. As the capacitor 16 charges, the voltage across the capacitor (VC1) increases. However, as noted above, the charging efficiency begins to decrease as VC1 diverges from the MPP.

In order to remove the excess charge before efficiency decreases too much, the solar cell circuit 10 has a switch (S1) 18 with firing thresholds of VC1 set to the MPP voltage ($V_{max}$) and the voltage where the capacitor 16 is discharged ($V_{min}$). In operation, the switch 18 closes when VC1 reaches $V_{max}$ and opens when VC1 reaches $V_{min}$. Thus, when the switch 18 is opened, the capacitor 16 and the inductor 20 discharge into the battery 14, and once the capacitor 16 and the inductor 20 discharge, the switch 18 is closed.

Closing the switch 18 creates a short circuit, thereby causing the solar cell 12 to output maximum current with no transfer of power to the battery 14. In an idealized model, the current would increase to infinity with no change in potential across the loop. As such, the solar cell circuit 10 includes an inductor 20 (L1) in series with the solar cell 12. As the current increases from the short circuit caused by the closed switch 18, a change in electrical potential is produced across the inductor 20. At the same time, the capacitor loses voltage with current flow. When the change in potential across the inductor 20 is greater than the potential across the capacitor 16, the current reverses direction and the capacitor 16 is recharged. In an idealized model (e.g., no resistance to dissipated energy), this process repeats itself in perpetuity. Thus, the use of the switch 18 keeps charge from transferring to the battery 14, and while the switch 18 is closed, the inductor/capacitor configuration continues to retain a voltage as the solar cell continues to generate electrons. When the switch 18 opens again, the solar cell 12 outputs the capacitor and inductor charge to the battery 14.

Figure 2A:
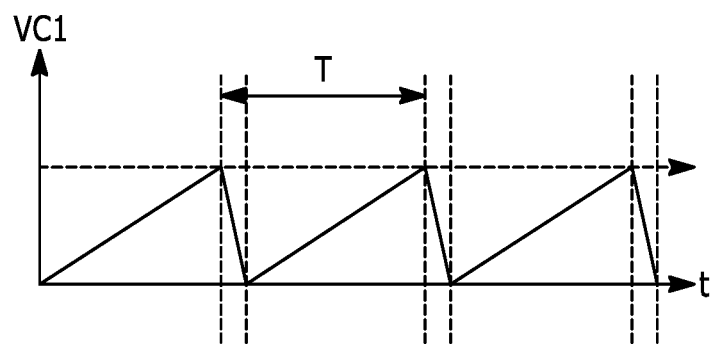
FIG. 2A is a waveform diagram of the charging voltage over time.
Figure 2B:
FIG. 2B is a waveform diagram of a switch signal controlling the charging voltage of FIG. 2A.

The opening and closing of the switch 18 results in a low level saw-tooth waveform timing for the voltage VC1 on the capacitor 16, as depicted in FIG. 2A. Assuming the firing thresholds for the switch 18 are constant in terms of timing with the voltage VC1 (as depicted in FIG. 2B), the frequency of VC1 is proportional to the light intensity falling upon the solar cell 12. That is, the greater the light intensity falling upon the solar cell 12, the greater the frequency of the waveform (and the smaller the period T of the waveform) for VC1. The lower the light intensity falling upon the solar cell 12, the lower the frequency of the waveform (and the higher the period T of the waveform) for VC1.

By monitoring the frequency or period of VC1, measurements of solar cell charge, and hence, light levels falling upon the solar cell can be performed by a controller. The relationship of saw tooth pulses to charge is Q=CV per cycle, with V being the peak-to-peak voltage of the saw tooth ($V_{max}-V_{min}=V_{p-p}$), C being the capacity of the capacitor 16, and Q being the charge in Coulombs. The maximum and minimum voltages of VC1 ($V_{max}$, $V_{min}$) are the thresholds set within the controller, and the switch 18 is switched when the capacitor 16 voltage cross these thresholds. This causes $V_{p-p}$ to be a fixed value, and the period T is a function of the amount of incident light falling upon the solar cell surface. By monitoring the period (or frequency) of the waveform, minor changes in light levels on the solar cell (shadow events) may be detected.

Figure 3A:
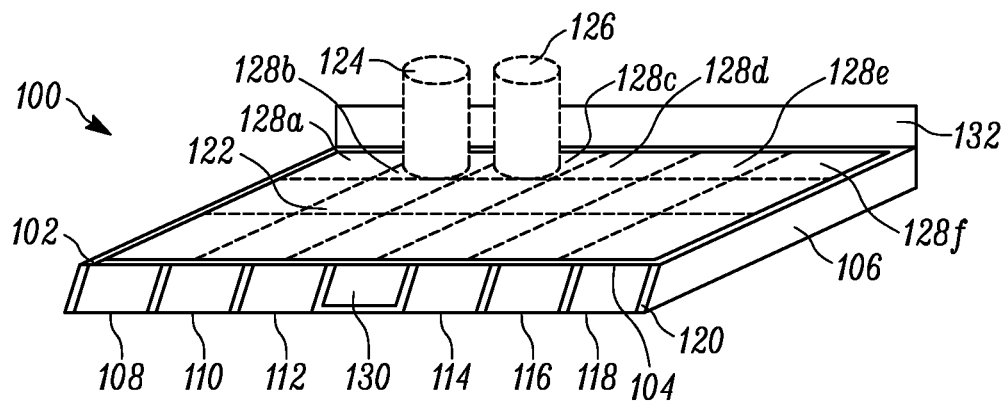
FIG. 3A is a perspective front view a shelf with a solar cell array and a display screen.

FIG. 3A is an exemplary depiction of a shelf 100. In particular, the shelf 100 includes a top surface 102 and a front edge 104. The shelf 100 may be manufactured from metal, ceramic, resin or any combination thereof. Generally speaking, the shelf 100 maintains integrity up to a particular weight threshold. The shelf 100 may include additional supports or struts 106 underneath the top surface 102, such as at the edges/side of the top surface 102 and along the underside of the shelf 100. The physical structure of the shelf 100 and variations thereof are well-understood by those of ordinary skill in the art, and requires no additional description for the purpose of this disclosure.

One or more solar cells 108-118 are preferably disposed along the front edge 104 of the shelf 100 so as to be positioned where they are likely to receive full light from, for example, overhead artificial store lighting. For example, the solar cells 108-118 in FIG. 3A are angled upwards by approximately 60 degrees from the surface 102 of the shelf 100 so as to have the surface of the solar cells 108-118 generally facing an overhead artificial light source. In an embodiment, the shelf 100 includes a front surface 120 upon which the solar cells 108-118 are positioned so as to provide stability to the solar cells 108-118. Each solar cell 108-118 is similar to the solar cell 12 depicted in FIG. 1, and each corresponds to a solar cell circuit for charging a battery, such as the solar cell circuit 10 depicted in FIG. 1. Preferably, each shelf or array of shelves has its own controller, though it should be understood that multiple shelves or arrays of shelves may operate in response to a controller common to all of the shelves, an example of which is disclosed below.

The shelf 100 may include one or more powered devices, such as a scale, position sensor, display screen, lights, transmitter/receiver, etc. As shown in FIG. 3A, the scale 122 is a thin, pressure sensing sheet or pad placed on the top surface 102 of the shelf 100. Alternative scales may also be utilized, such as spring scales that are calibrated to balance against the weight of the shelf or strain gauge scales. The weight of objects 124, 126 placed on the top surface of the shelf is measured by the scale 122, and a signal is sent to the controller which interprets the signal to determine the weight of the contents 124, 126 on the shelf 100.

In an embodiment, the sensor pad may be provided as both a scale and/or a position sensor having discrete sections 128b, 128c within the pad (shown in broken line) that indicate where contents 124, 126 are placed on the shelf 100, and sections 128a, 128d-128f that indicate where there are no contents. As contents 124, 126 are added or removed from the shelf 100, each section 128a-128f may generate pressure signals which are sent by the pad to the controller which are interpreted to indicate where contents 124, 126 are on the shelf, and compared to previous signals to identify changes in the number of contents 124, 126 on the shelf 100 and/or changes in position of the contents 124, 126 on the shelf 100.

In an embodiment, a display screen 130 is included on the shelf 100. In the embodiment shown in FIG. 3A, the display screen 130 is positioned along the front edge 104 of the shelf 100 along with the array of solar cells 108-118. In other embodiments, however, a single display screen 130 may be provided for multiple shelves, such as a display screen 130 on one of an array of shelves. In other embodiments, the display screen 130 may be positioned towards the back or above the surface 102 of shelf 100. In any event, the display screen 130 is generally positioned so as to be viewable from the front of the shelf.

An illuminating light assembly 132 may also be mounted in or on the shelf 100, such as towards the back of the shelf surface 102. The illuminating light assembly 132 includes an illumination light source, such as at least one light emitting diode (LED), and preferably a plurality of illumination LEDs, configured to generate a substantially uniform distributed light on and along the top surface 102 of the shelf 100.

Figure 3B:
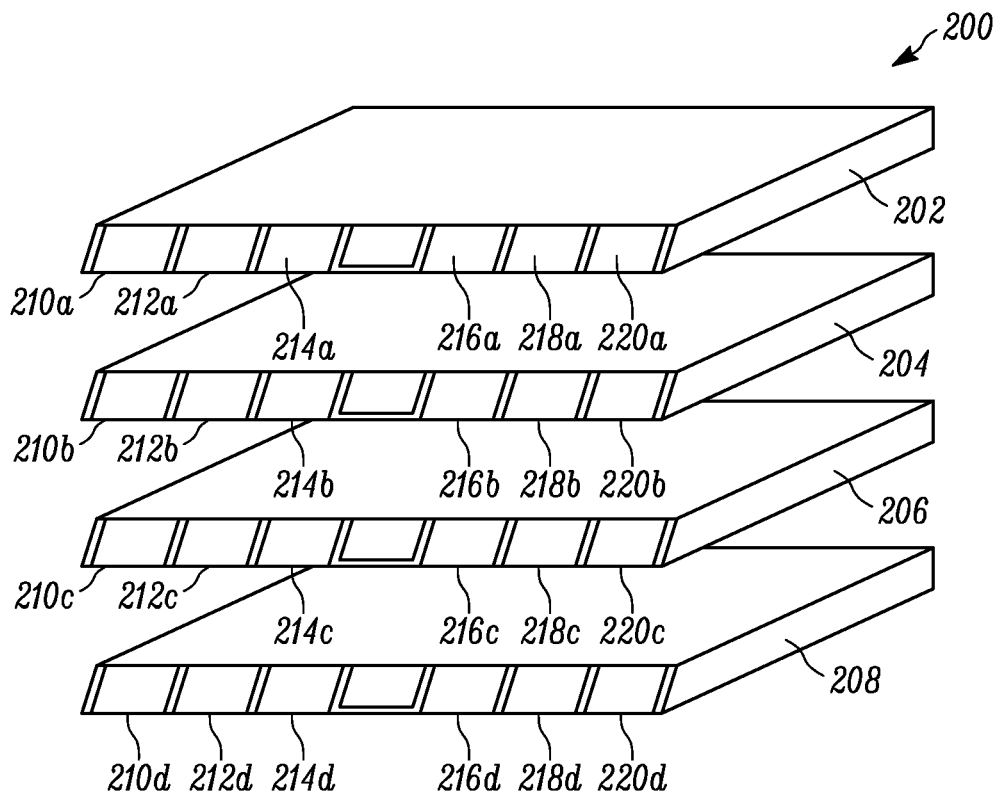
FIG. 3B is a perspective front view of an array of shelves each with a solar cell array and display screens.

As shown in FIG. 3B, a plurality of shelves 202-208, each of which may correspond to the shelf 100 of FIG. 3A, may be arranged as an array 200. Although shown as a vertical array, those of ordinary skill in the art will also understand that the shelves may be arrayed horizontally. As described with reference to FIGS. 1, 2A and 2B, each solar cell 210a-d, 212*a-d*, 214*a-d*, 216*a-d*, 218*a-d*, 220*a-d* is effectively a large, light-sensitive pixel. Where a row of solar cells extend along each shelf 202-208 on each level in the array 200, the entire array of solar cells 210*a-d*, 212*a-d*, 214*a-d*, 216*a-d*, 218*a-d*, 220*a-d* form a large array of large light-sensitive pixels. This effect is doubled where arrays 200 of shelves face each other across an aisle.

Because the waveform for VC1 is affected by the light intensity falling upon the solar cell 12, each solar cell circuit 10 effectively acts as a large, light-sensitive pixel, such that shadows of objects passing in front of the solar cells 12 ("shadow events") may be detected, as the shadows decrease the intensity of light falling on the solar cell 12, thereby decreasing the frequency and increasing the period of the waveform for VC1. For example, if a person were to walk in front of the array 200 of shelves, there would be an increase in the period T from the person's shadow being cast across the solar cell(s). Moreover, if a person were to approach and/or reach across the solar cells to remove an item on a shelf, the period T would increase even further, as the person's shadow cast across the solar cells is darker than if the person were simply walking by. It is noted that this assumes a relatively constant light intensity falling on the general area of the solar cells 12 (e.g., as may be found with indoor artificial lighting). Such shadow events may be used to trigger the controller to initiate various processes of the devices connected to, and powered by, the solar cells.

Figure 4:
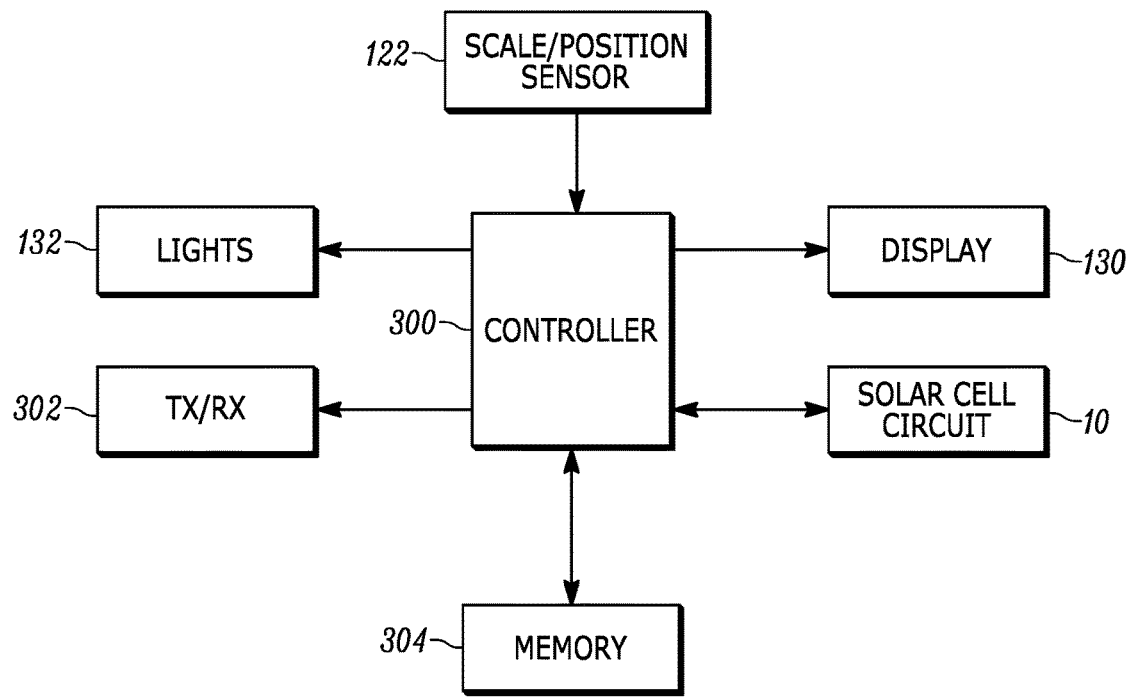
FIG. 4 is a schematic of various components of the shelf of FIG. 3A.

As also shown in FIG. 4, the solar cells 108-118 and corresponding solar cell circuits, the scale/position sensor 122, the display screen 130, and the illumination LED assembly 132 of FIG. 3A, as well as a communication transmitter/receiver 302 (e.g., Bluetooth transmitter/receiver, WiFi transmitter/receiver based on the IEEE 802.11 standards, etc.) are operatively connected to a controller or programmed microprocessor 300 operative for controlling the operation of these components. A memory 304 is connected and accessible to the controller 300. Preferably, the microprocessor 300 is the same as the one used for processing the data from the scale(s), position sensor(s), display screen(s) and illumination assembly(ies), of the same shelf or group of shelves forming an array or other arranged grouping, such as opposing shelves of an aisle and/or end caps at each end of the aisle. Multiple controllers, such as one for each aisle in a store, may be communicatively coupled to each other and/or a centralized server so as to form a network of controllers.

The controller 300 includes a processor, that monitors the frequency or period of VC1. In an embodiment, the controller 300 is provided as a control integrated circuit (IC). When the controller 300 detects a change in the frequency or period of VC1, it is interpreted as a shadow event (i.e., an object has cast a shadow across the solar cell 12, thereby changing the waveform timing for VC1). The shadow event may be assumed to be a person, such as a customer in a store, passing in front of the shelf.

While the battery 14 is charging, the controller 300 may be in a low power mode, such that it minimizes the use of power from the battery 14. The detection of a shadow event triggers the controller 300 to exit the low power mode and execute controller services. For example, the controller 300 may generate an image on the display screen 130 (e.g., video, text, etc.), in order to provide notification of product identification, pricing, sales, coupons, etc. In an additional embodiment, the controller 300 may be programmed to read a weight measurement from the scale 122 or otherwise monitor the scale 122 for changes in weight. In another embodiment, the controller 300 may be programmed to monitor the position sensor 122 to detect removal of contents from the shelf or addition of contents to the shelf, such as if a customer picks up a product from the shelf, puts it back, etc. In a further embodiment, the controller 300 may activate the illumination assembly 132 to better illuminate the products on the shelf. In yet another embodiment, and the controller may be programmed to activate the communications device 302 in an attempt to communicate with a client computing device within the vicinity of the shelf, such as a smartphone or tablet of the customer in order to provide notification of product sales, coupons, etc.

The controller 300 may be programmed to not only detect shadow events by monitoring the frequency or period of the waveform for VC1, but also to determine the relative closeness of the object to the solar cell based on the frequency or period of the waveform for VC1. For example, the farther an object is from the solar cell 12, the less shadow is cast on the solar cell 12. On the other hand, the closer an object is to the solar cell 12, the darker the shadow cast on the solar cell 12. Thus, an object farther away from the solar cell 12 would cause a greater frequency and smaller period in the waveform for VC1 as compared to an object closer to the solar cell 12.

Further, the controller 300 may be programmed to detect the rate of change in frequency or period of the waveform for VC1 in order to determine whether the object is moving towards or away from the solar cell 12. For example, if the object is moving away from the solar cell, the frequency of the waveform of VC1 would increase (and the period decrease), as light intensity incident upon the solar cell 12 increases. On the other hand, if the object is moving towards the solar cell, the frequency of the waveform of VC1 would decrease (and the period increase), as light intensity upon the solar cell 12 decreases. Where an array 200 of solar cells 12 are utilized, particularly in a horizontal array, the controller may monitor the direction in which the object is moving by monitoring the frequency or period of each of the solar cells 12, where the frequency or period of the waveform for VC1 will change for each solar cell 12 as the object moves along the array of solar cells, and revert to the normal waveform timing once the shadow event is over.

Still further, the controller 300 may be programmed to use the rate of change in frequency or period of the waveform for VC1 in order to determine the relative speed at which the object is moving. For example, if the object is moving slowly towards the solar cell 12, the frequency of the waveform for VC1 would decrease (and the period increase) more slowly than if the object is moving quickly towards the solar cell 12, in which case the frequency of the waveform for VC1 would decrease (and the period increase) more quickly. Similarly, if the object is moving slowly away from the solar cell 12, the frequency of the waveform for VC1 would increase (and the period decrease) more slowly than if the object is moving quickly away from the solar cell 12, in which case the frequency of the waveform for VC1 would increase (and the period decrease) more quickly. Furthermore, if the rate of change of the frequency exhibits a cosine pattern, the object can be considered to have passed by tangentially.

Figure 5:
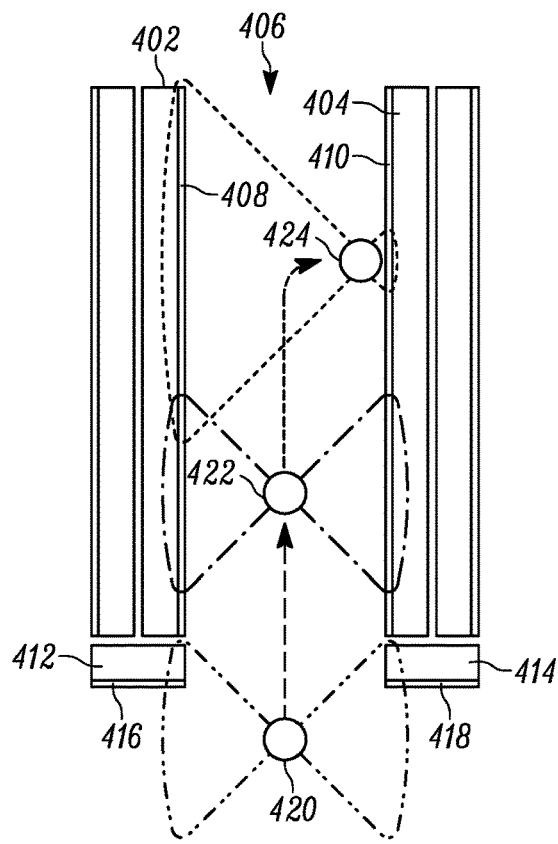
FIG. 5 is a layout view of shelves of FIGS. 3A and 3B.

FIG. 5 depicts an exemplary layout of an array or arrays of shelves as described above, such that a first array of shelves 402 faces a second array of shelves 404 across an aisle 406. More particularly, a solar cell array 408 of the first array of shelves 402 faces a solar cell array 410 of the second array of shelves 404. In addition, the entrance(s) to the aisle 406 may be flanked by arrays of shelves 412, 414 on either side of the entrance (e.g., end caps), the fronts of which face perpendicular to the fronts of the first and second array of shelves 402, 404 and outwardly from the aisle 406. In this embodiment, each of these end cap shelves 412, 414 has a solar cell array 416, 418, respectively, on the front edge of the shelves.

As an object, such as a person, enters and traverses the aisle 406 as indicated by the dashed line, the waveform for the charging voltage VC1 of various solar cells in the solar cell arrays 408, 410, 416, 418 changes in response to the object casting shadows. For example, as the object approaches the entrance of the aisle 406 at a first position 420, the object casts a shadow on one or more solar cells in the solar cell arrays 416, 418 of the end cap shelves 412, 414 as indicated by the dash-dot-dot line. This causes the waveform for VC1 of the affected solar cells in the solar cell arrays 416, 418 to experience a longer period T (or decreased frequency) as a result of this shadow event, which, in turn, may trigger a controller associated with the aisle 406 to exit a low power mode. In addition, the controller may activate the scale, position sensor, display, communication transmitter/receiver and/or illumination assembly for the end cap shelves 416, 418.

As the object enters the aisle 406, the object moves to a second position 422 and casts a shadow on one or more solar cells in the solar cell arrays 408, 410 of the shelves 402, 404 as indicated by the dash-dot line. This causes the waveform for VC1 of the affected solar cells in the solar cell arrays 408, 410 to experience a longer period T (or decreased frequency) as a result of this shadow event, which, in turn, may trigger the controller to activate the scale, position sensor, display, communication transmitter/receiver and/or illumination assembly for the shelves of the affected solar cells. With the display, the controller may generate a particular image to be displayed, such as the names of brands and pricing of products on the corresponding shelf. On the other hand, the waveform for VC1 of the solar cell arrays 416, 418 of the end cap shelves 412, 414 returns to normal, and the controller may put the devices associated with the end cap shelves 412, 414 into a low power or "sleep" mode, or deactivate those devices. Knowledge of objects or people passing into and or out of the aisle can be used to generate use maps of retail space.

At a third position 424, the object has approached one of the shelves, or a portion of the array of shelves 404, and casts a shadow on one or more solar cells in the solar cell arrays 408, 410 of the shelves 402, 404 as indicated by the dotted line. As shown therein, the third position 424 is closer to the second array of shelves 404 than the first array of shelves 402. This has the effect of casting a darker shadow on one or more of the solar cells of the solar cell array 410 than on the solar cells of the solar cell array 408. This causes the waveform for VC1 on the affected solar cells in the solar cell array 410 to experience a longer period T (or decreased frequency) than the period T (or frequency) of the waveform for VC1 on the affected solar cells of the first solar cell array 408. This may cause the controller to activate (or keep active) the scale, position sensor, display, communication transmitter/receiver and/or illumination assembly for the shelves of the affected solar cells in the second solar cell array 410. On the other hand, the controller may put the devices associated with the first array of shelves 402 into a low power or "sleep" mode, or deactivate those devices. In an embodiment, the controller may even determine which shelf in the second array of shelves 404 a person is reaching over for a product based on the waveform of VC1 for the solar cells of that particular shelf. Using the scale/position sensor, the controller may determine which product the person removed and/or whether the person put the product back. The darker shadow and/or signal from the scale/position sensor may cause the controller to generate a different image on the display, such as an advertisement for a particular brand of product on the corresponding shelf.

Figure 6A:
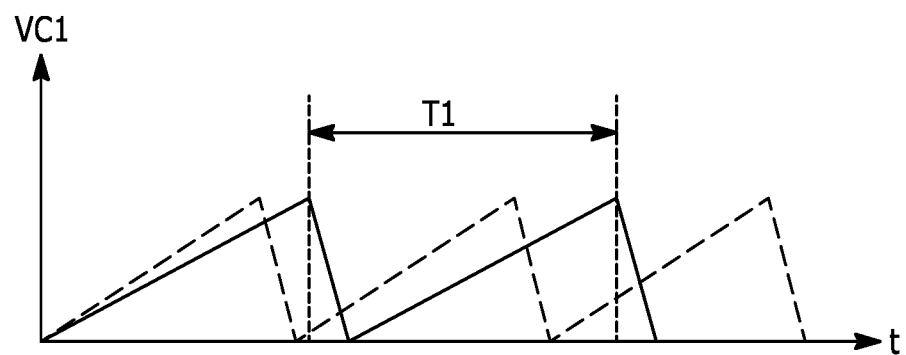
FIG. 6A is a waveform diagram of the charging voltage as affected by a first shadow event.
Figure 6B:
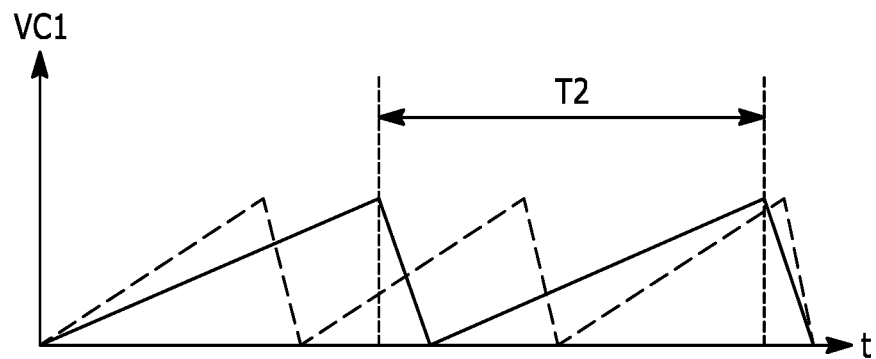
FIG. 6B is a waveform diagram of the charging voltage as affected by a second shadow event.

FIGS. 6A and 6B depict examples of changes in the period T or frequency in the waveform for VC1 of a solar cell circuit in response to a shadow event, as compared to the waveform for VC1 as shown in FIG. 2A (shown in dashed line). As seen in FIG. 6A, a shadow event causes the period of the waveform for VC1 to change value to T1, which is longer than the period T of the original waveform for VC1. Again, with less light falling on the solar cell, the longer it takes for VC1 to reach $V_{max}$. Such a shadow event may correspond to a person entering and/or proceeding down the aisle 406 in the first and second positions 420, 422 of FIG. 5.

On the other hand, as a person gets closer to a solar cell, such as in the third position 424 of FIG. 5, the period T2 of the waveform for VC1 is even longer as shown in FIG. 6B, because the shadow falling on the solar cell is darker than if the person was at the first or second positions 420, 422. By detecting these changes in the period (or frequency) of the waveform for VC1, the controller is able to execute the above-described controller services.

In addition, by monitoring the changes in the waveforms of FIGS. 6A and 6B, the controller is able to interpret whether a person is moving towards or away from a particular solar cell. For example, by monitoring the waveforms of VC1 for various solar cells along the array of shelves 402, 404, the controller can see which solar cells are experiencing a shadow event, which are not, and in what sequence. By monitoring the magnitude of the period of the waveform for VC1, the controller may determine the approximate position of the person in the aisle 406. Further, by monitoring the speed with which the waveforms change (e.g., between FIG. 6A and FIG. 6B) the controller can determine how quickly the person is moving towards a particular solar cell, such as a motion by the person to reach for a product, which is generally a "high rate of change" movement resulting in a high rate of change shadow event as compared to the person walking by the solar cell.

In response to the shadow events as detected by the controller as a result of the person in the aisle 406, the controller may determine not only that the person has entered the aisle 406, but also the person's likely interest in products based on the person moving towards or away from sections of the aisle 406, towards or away from sections of the first and second arrays of shelves 402, 404, reaching for products on a particular shelf, removing/replacing products on a particular shelf, etc. In response to these various action, the controller may not only activate/deactivate devices as indicated above, but may also control the devices. For example, if a person approaches a section of the array of shelves 404 as indicated by the third position in FIG. 5, the controller may cause an image to be displayed on the display screen, such as an advertisement for a nearby or related product. In another embodiment, if the activation of the communication transmitter/receiver resulted in communication with the person's computing device (e.g., Bluetooth link, WiFi link, etc.), the controller may send a message to the person's computing device offering an advertisement or coupon for a nearby or related product. By monitoring the scale/position sensor, the controller may detect which products are chosen by the person based on known locations for the products on the shelves, and/or which are replaced by the person, in response to which the controller may generate an image on the display screen and/or communicate with the person's computing device related to the selected product or to a different brand of the product, such as advertising a discount or offering a coupon.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A system comprising:
   a plurality of shelves each having a front edge;
   a solar cell circuit disposed at the front edge of each of the plurality of shelves; and
   a controller operatively coupled to the solar cell circuits, the controller adapted to monitor a frequency of a saw-tooth waveform at which a power transfer of each solar cell circuit occurs, and adapted to signal a device in response to a change in the frequency of the saw-tooth waveform at which the power transfer occurs.

2. The system of claim 1, further comprising:
   a plurality of display screens, wherein a display screen is disposed at the front edge of each of the plurality of shelves.

3. The system of claim 1, wherein the front edges of a first set of the plurality of shelves face the front edge of a second set of the plurality of shelves.

4. The system of claim 3, wherein the controller is adapted to activate a processor in response to a change in the frequency of the saw-tooth waveform at which the power transfer occurs in at least one solar cell circuit of the first set of shelves and in at least one solar cell circuit of the second set of shelves.

5. The system of claim 4, wherein the controller is adapted to activate the processor in response to the frequency of the saw-tooth waveform at which the power transfer occurs being lower than a first threshold in at least one solar cell circuit of the first set of shelves and in at least one solar cell circuit of the second set of shelves.

6. The system of claim 5, further comprising a display screen, wherein the controller is adapted to activate the display screen in response to the frequency of the saw-tooth waveform at which the power transfer occurs being lower than a second threshold in a solar cell circuit of one of the plurality of shelves, the second threshold being lower than the first threshold.

7. The system of claim 6, wherein the controller is adapted to cause a first image to be displayed on the display screen in response to the frequency of the saw-tooth waveform at which the power transfer occurs being lower than the second threshold in a first one of the solar cell circuits, and adapted to cause a second image to be displayed on the display screen in response to the frequency of the saw-tooth waveform at which the power transfer occurs being lower than the second threshold in a second one of the solar cell circuits.

8. The system of claim 5, wherein the controller is adapted to signal the processor to enter a sleep mode in response to the frequency of the saw-tooth waveform at which the power transfer occurs being higher than or equal to the first threshold.

9. The system of claim 3, wherein the front edges of a third set of the plurality of shelves are perpendicular to the front edges of the first and second sets of the plurality of shelves.

10. The system of claim 9, wherein the controller is adapted to activate the processor in response to a change in the frequency of the saw-tooth waveform at which the power transfer occurs in at least one solar cell circuit of the third set of shelves.

* * * * *